United States Patent
Koyama et al.

(10) Patent No.: US 10,192,807 B2
(45) Date of Patent: Jan. 29, 2019

(54) POWER SEMICONDUCTOR MODULE, FLOW PATH MEMBER, AND POWER-SEMICONDUCTOR-MODULE STRUCTURE

(71) Applicant: FUJI ELECTRIC CO., LTD., Kawasaki-shi, Kanagawa (JP)

(72) Inventors: Takahiro Koyama, Matsumoto (JP); Hiromichi Gohara, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/606,787

(22) Filed: May 26, 2017

(65) Prior Publication Data

US 2017/0263533 A1    Sep. 14, 2017

Related U.S. Application Data

(63) Continuation of application No. PCT/JP2016/068018, filed on Jun. 16, 2016.

(30) Foreign Application Priority Data

Jun. 17, 2015    (JP) ................................ 2015-122283

(51) Int. Cl.
*H01L 23/34* (2006.01)
*H01L 23/473* (2006.01)
(Continued)

(52) U.S. Cl.
CPC ........ *H01L 23/473* (2013.01); *H01L 23/3675* (2013.01); *H01L 23/4006* (2013.01);
(Continued)

(58) Field of Classification Search
CPC ............... H01L 23/473; H01L 23/4006; H01L 23/3675; H01L 25/18; H01L 25/07;
(Continued)

(56) References Cited

U.S. PATENT DOCUMENTS 4,968,066 A * 11/1990 Adams .................. F16L 41/086
285/142.1
7,692,923 B2 * 4/2010 Nakamura ......... H05K 7/20927
165/104.33
(Continued)

FOREIGN PATENT DOCUMENTS

CN    101252307 A    8/2008
JP    2005-166867 A   6/2005
(Continued)

OTHER PUBLICATIONS

PCT/ISA/210, "International Search Report for International Application No. PCT/JP2016/068018," dated Jul. 19, 2016.
(Continued)

*Primary Examiner* — Vu A Vu
(74) *Attorney, Agent, or Firm* — Manabu Kanesaka

(57) ABSTRACT

The invention is provided with a metal base plate including a first surface and a second surface and a cooling case including a bottom wall and a side wall formed around the bottom wall, in which one end of the side wall being joined to a second surface side of the metal base plate, and a coolant can be circulated in a space enclosed by the metal base plate, the bottom wall, and the side wall, in which the cooling case has an inlet portion and an outlet portion for the coolant which are connected to either the bottom wall or the side wall and disposed along a peripheral edge of the second surface of the metal base plate, and includes a first flange disposed at an inlet opening side of the inlet portion and a second flange disposed at an outlet opening side of the outlet portion.

23 Claims, 12 Drawing Sheets

(51) Int. Cl.
    *H01L 25/07*      (2006.01)
    *H01L 25/18*      (2006.01)
    *H01L 23/367*     (2006.01)
    *H01L 23/40*      (2006.01)
    *H01L 23/373*     (2006.01)

(52) U.S. Cl.
    CPC .............. *H01L 25/07* (2013.01); *H01L 25/18* (2013.01); *H01L 23/3735* (2013.01); *H01L 2224/49111* (2013.01); *H01L 2224/49113* (2013.01)

(58) Field of Classification Search
    CPC ....... H01L 23/3735; H01L 2224/49113; H01L 2224/49111
    USPC ....................................................... 257/714
    See application file for complete search history.

(56) References Cited

U.S. PATENT DOCUMENTS 7,835,151 B2 * 11/2010 Olesen .................. H01L 23/473
                                                    165/121

| | | | |
|---|---|---|---|
| 2009/0072386 | A1 | 3/2009 | Hasegawa |
| 2010/0071396 | A1 | 3/2010 | Jadric et al. |

FOREIGN PATENT DOCUMENTS

| | | | |
|---|---|---|---|
| JP | 2006-324647 | A | 11/2006 |
| JP | 2008-251932 | A | 10/2008 |
| JP | 2011-103369 | A | 5/2011 |
| JP | 2012-064609 | A | 3/2012 |
| JP | 2013-513240 | A | 4/2013 |
| JP | 5341718 | B2 | 11/2013 |
| JP | 2014-082283 | A | 5/2014 |
| JP | 2014-179563 | A | 9/2014 |
| JP | 2015-053410 | A | 3/2015 |
| WO | 2008/029858 | A1 | 3/2008 |

OTHER PUBLICATIONS

China Patent Office, "Office Action for Chinese Patent Application No. 201680003922.5," dated Oct. 29, 2018.

* cited by examiner

POWER SEMICONDUCTOR MODULE, FLOW PATH MEMBER, AND POWER-SEMICONDUCTOR-MODULE STRUCTURE

CROSS-REFERENCE TO RELATED APPLICATIONS

This application is a continuation of PCT Application No. PCT/JP2016/068018, which claims priority to Japanese Patent Application No. 2015-122283, filed Jun. 17, 2015 and PCT Application No. PCT/JP2016/064456, filed May 16, 2016 which claims priority to Japanese Patent Application No. 2015-122283, filed Jun. 17, 2015. The contents of these applications are incorporated herein by reference in their entirety.

TECHNICAL FIELD

The present invention relates to a power semiconductor module including a cooler which allows a coolant for cooling a semiconductor element to circulate and flow, a flow path member to be combined with the power semiconductor module, and a power-semiconductor-module structure.

BACKGROUND ART

In a device using a motor, typically such as a hybrid vehicle or an electric vehicle, a power conversion device is used to save energy. In such a power conversion device, a power semiconductor module is widely used. Such a power semiconductor module includes a power semiconductor element for controlling high current.

The power semiconductor element has a large heat generation amount when controlling high current. Further, reduction in size and weight of the power semiconductor module has been demanded and there is a tendency for output density to increase so that in the power semiconductor module including the plurality of power semiconductor elements, a cooling method thereof influences a power conversion efficiency.

To improve a cooling efficiency of the power semiconductor module, there is a power semiconductor module which includes a liquid cooling type cooling body, in which the cooling body cools generated heat of the power semiconductor element. Such a cooling body of the power semiconductor module includes: a metal base plate which transfers generated heat of the power semiconductor element; a heat sink joined to a rear surface of the metal base plate; and a cooling case which is joined to the metal base plate and houses heat sink, and has such a configuration as to be capable of circulating a coolant in a space in the cooling case through an inlet opening and an outlet opening which are provided to the cooling case (Patent Document 1). To the inlet opening and the outlet opening, for example, a nipple is attached, and an external pipe or an external hose is connected, respectively.

In a hybrid vehicle or an electric vehicle, a space for mounting the power semiconductor module is limited. Thus, there are cases that mounting the power semiconductor module and attaching to the inlet opening and the outlet opening of the cooling case the external pipe are not easy. Further, an operation of mounting the power semiconductor module and an operation of attaching to the inlet opening and the outlet opening of the cooling case the external pipe are required to be separately performed so that the operations require much labor.

With respect to a cooling member of the power semiconductor module, there is one which includes a connection plate at an inlet passage and an outlet passage to facilitate connection to an additional cooling member or terminal end plate (Patent Document 2). However, in such a cooling member, the inlet passage and the outlet passage are provided to a side surface of a plastic base having a top surface to which the semiconductor module is fitted so that the semiconductor module to which the cooling member is attached becomes bulky. Moreover, because the connection plate of the cooling member is not to be connected to an external pipe, easiness of attaching the external pipe has not been sufficient. Further, there remains a problem that an operation of mounting to a hybrid vehicle, an electric vehicle or the like the power semiconductor module and an operation of attaching to the inlet passage and the outlet passage of the cooling member the external pipe are required to be separately performed.

RELATED ART DOCUMENTS

Patent Documents

Patent Document 1: Japanese Unexamined Patent Application Publication No. 2012-64609
Patent Document 2: Japanese Translation of PCT International Application Publication No. JP-T-2013-513240

SUMMARY OF THE INVENTION

Problems to be Solved by the Invention

The present invention has been made in view of such respects, and has an object to provide a power semiconductor module which can facilitate connection to an inlet opening and an outlet opening of a cooling body of the power semiconductor module and also can facilitate an operation of mounting the power semiconductor module, a flow path member to be combined with the power semiconductor module, and a power-semiconductor-module structure.

Means for Solving the Problems

To achieve the object as described above, as an embodiment of the present invention, a power semiconductor module as described below is provided.

The power semiconductor module includes: a metal base plate including a first surface and a second surface; a multi-layer substrate joined to the first surface and including a third surface and a fourth surface; a semiconductor element carried on the third surface; a resin case disposed on the first surface side of the metal base plate and surrounding the multi-layer substrate and the semiconductor element; and a cooling case. The cooling case includes a bottom wall and a side wall formed around the bottom wall, one end of the side wall being joined to the second surface side of the metal base plate, such that a coolant can be circulated in a space enclosed by the metal base plate, the bottom wall, and the side wall. The cooling case has an inlet portion and an outlet portion for the coolant the inlet portion and the outlet portion being connected to either the bottom wall or the side wall and disposed along a peripheral edge of the second surface of the metal base plate, the cooling case including a first flange disposed at an inlet opening side of the inlet portion and a second flange disposed at an outlet opening side of the outlet portion.

To achieve the object as described above, as another embodiments of the present invention, a flow path member as described below is provided.

The flow path member is combined with the power semiconductor module as described above. The power semiconductor module includes: a metal base plate; and a cooling case including a bottom wall and a side wall formed around the bottom wall, one end of the side wall being joined to a rear surface of the metal base plate, such that a coolant can be circulated in a space enclosed by the metal base plate, the bottom wall, and the side wall. Further, the cooling case has an inlet portion and an outlet portion for the coolant the inlet portion and the outlet portion being connected to either the bottom wall or the side wall and disposed along a peripheral edge of the rear surface of the metal base plate, the cooling case including a first flange disposed at an inlet opening side of the inlet portion and a second flange disposed at an outlet opening side of the outlet portion. The flow path member includes a first connection portion capable of being connected to the first flange, a second connection portion capable of being connected to the second flange, a first flow path connected to the first connection portion and capable of circulating the coolant, and a second flow path connected to the second connection portion and capable of circulating the coolant, and is capable of being disposed to face a bottom surface of the cooling case.

A power-semiconductor-module structure of the present invention in which the power semiconductor module as described above and the flow path member as described above are combined with each other provides an embodiment as described below.

The power-semiconductor-module structure consists of the power semiconductor module and the flow path member combined with each other.

Effects of the Invention

According to the power semiconductor module of the present invention, connection to an inlet opening and an outlet opening of a cooling body of the power semiconductor module can be facilitated and also an operation of mounting the power semiconductor module can be facilitated.

BRIEF DESCRIPTION OF THE DRAWINGS

FIG. 10 B is a perspective view of the appearance of another embodiment of the power semiconductor module of the present invention as seen from a rear surface side.

FIG. 11 B is a perspective view of the appearance of the conventional power semiconductor module as seen from a rear surface side.

MODE FOR CARRYING OUT THE INVENTION

Embodiments of a power semiconductor module of the present invention will be specifically described with reference to the accompanying drawings. The terms indicating such directions as "upper," "lower," "bottom," "front," and "rear" are used with reference to the directions in the accompanying drawings.

First Embodiment

Figure 1:
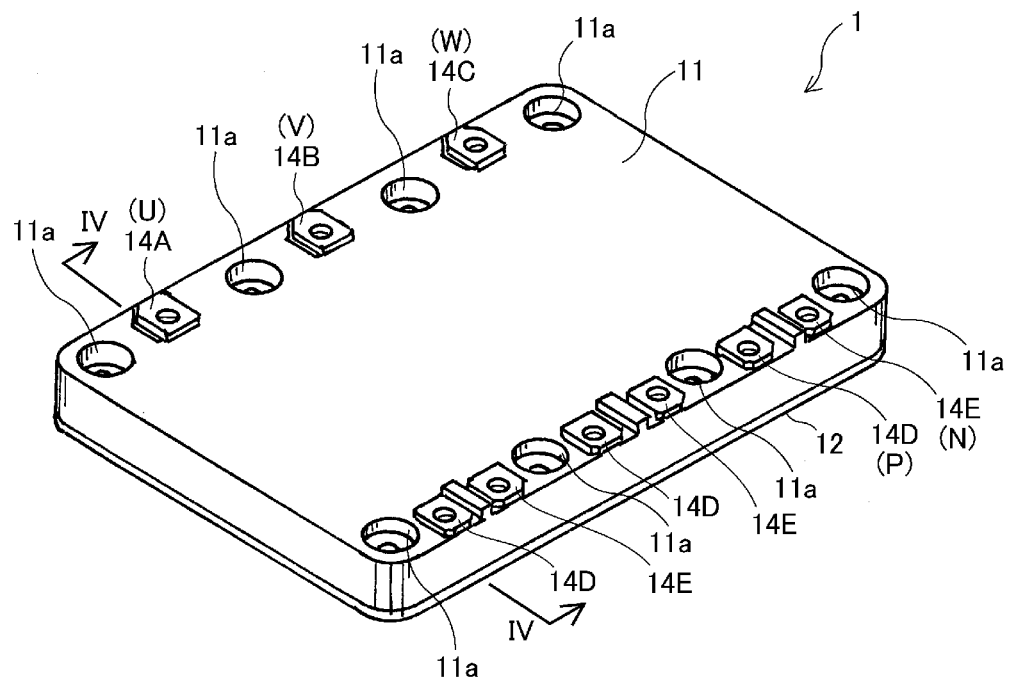
FIG. 1 is a perspective view illustrating an appearance of an embodiment of a power semiconductor module of the present invention.
Figure 2:
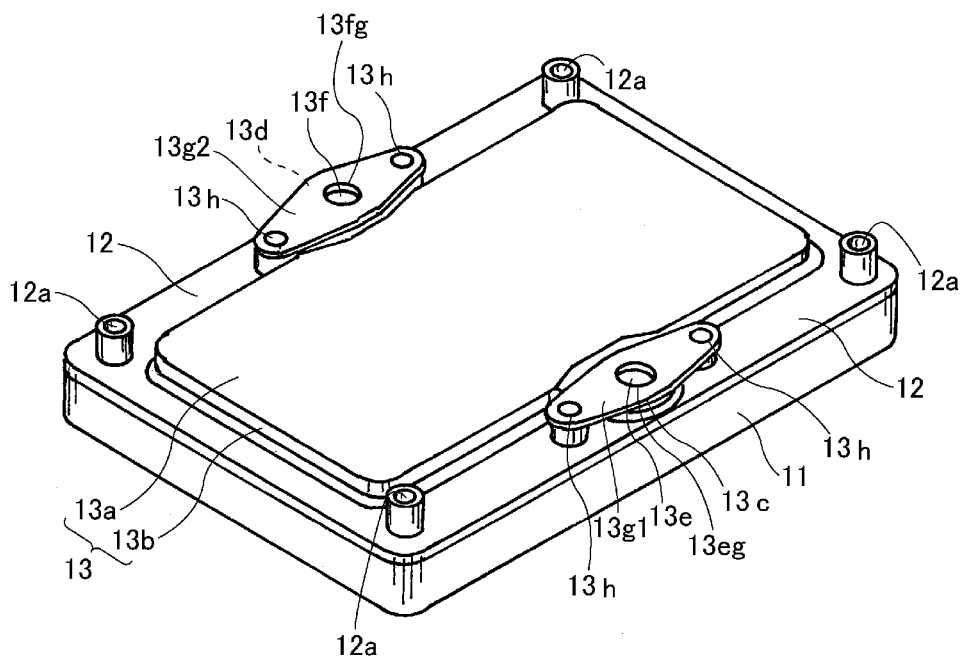
FIG. 2 is a perspective view of the power semiconductor module of FIG. 1 as seen from a rear surface.

FIG. 1 is a perspective view illustrating an appearance of an embodiment of a power semiconductor module of the present invention. FIG. 2 is a perspective view of the power semiconductor module of FIG. 1 as seen from a rear surface side. A power semiconductor module 1 as illustrated in FIGS. 1 and 2 is a 6-in-1 type power semiconductor module which composes an inverter circuit. The power semiconductor module 1 includes a metal base plate 12, a resin case 11 housing a semiconductor chip 16 in which a bottom surface is bonded to a front surface of the metal base plate 12, and a cooling case 13 joined to a rear surface of the metal base plate 12.

From the interior of the resin case 11 and along a periphery of an upper surface of the resin case 11, external terminals 14A-14E project. Further, the resin case 11 is provided with through holes 11a which penetrate in a thickness direction thereof. A total of eight through holes 11a are formed at the vicinity of both ends of a longitudinal edge portion of the upper surface of the resin case 11 and at two spaced points between the both ends. From among such through holes 11a, the two through holes 11a formed near a longitudinal center at a long side one end portion of the resin case 11 are first through holes which can penetrate in accordance with first bolt holes formed at a flange 13g1 of the cooling case 13 as described below. Meanwhile, the two through holes 11a formed near a longitudinal center at a long side the other end portion of the resin case 11 are second through holes which can penetrate in accordance with second bolt holes formed at a flange 13g2 of the cooling case 13 as described below.

The metal base plate 12 is a rectangular plate having a front surface, i.e. a first surface and a rear surface which is opposed to the front surface, i.e. a second surface. The metal base plate 12 has substantially the same size as the resin case 11. As illustrated in FIG. 2, the metal base plate 12 is provided with through holes 12a which penetrate in a thickness direction thereof. Such through holes 12a are formed at the same intervals as the through holes 11a provided to the resin case 11 and disposed at the same positions as the through holes 11a.

Figure 3:
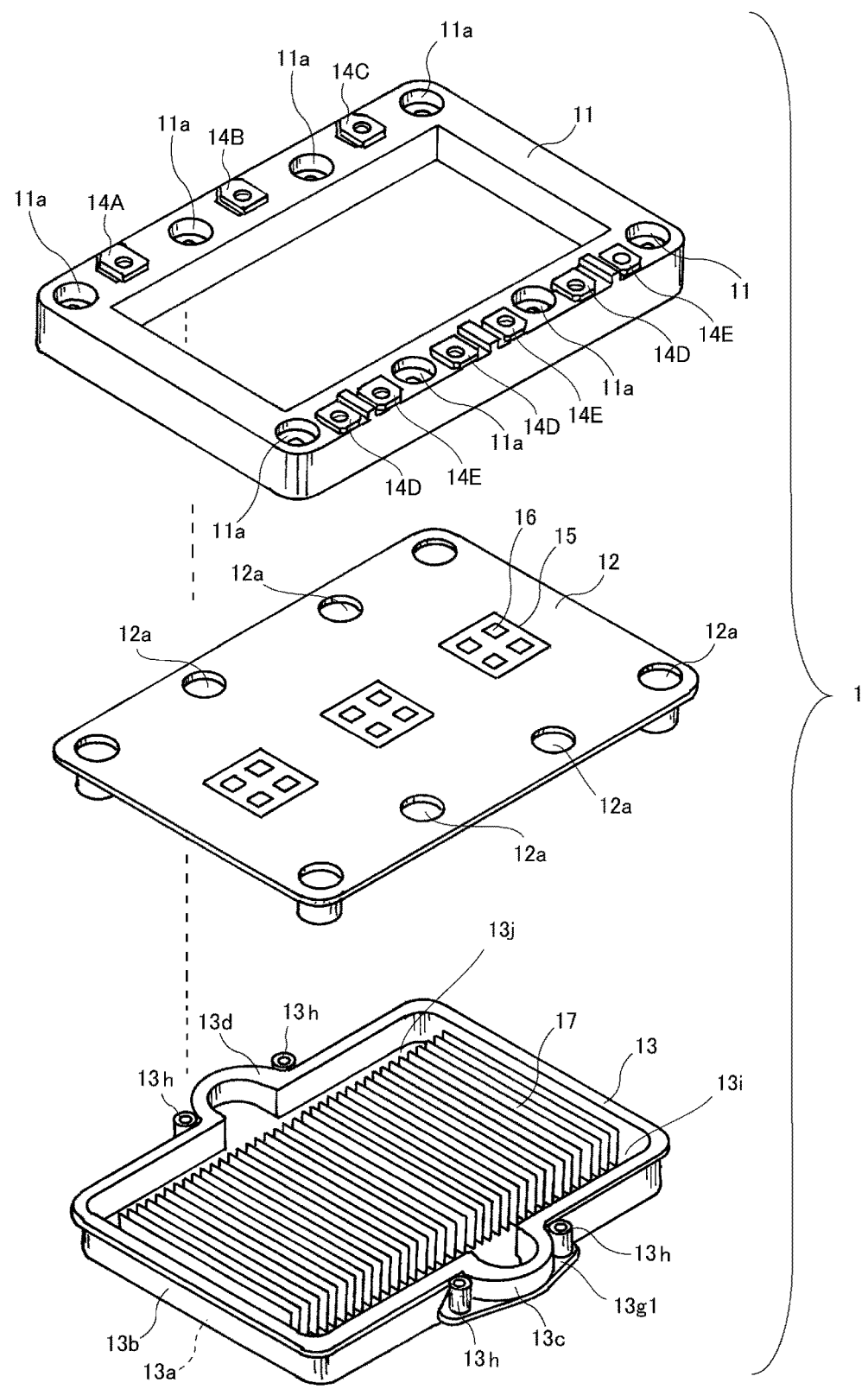
FIG. 3 is an exploded perspective view of the power semiconductor module of FIG. 1.

The cooling case 13 joined to the rear surface of the metal base plate 12 includes a bottom wall 13a and side walls 13b formed around the bottom wall 13a and opens at an upper end side. An upper end of the cooling case 13 is joined to the metal base plate 12 by brazing, for example, whereby an internal space enclosed by the metal base plate 12 and the cooling case 13 is formed. As illustrated in FIG. 3, in such an internal space, fins 17 as a heat sink are provided. The metal base plate 12, the cooling case 13, and the fins 17 compose a cooling body for the semiconductor chip 16. Note that the fins 17 are not limited to those having a thin plate shape as illustrated, but may be those having a pin shape. The internal space of the cooling case 13 can circulate a coolant supplied from the exterior.

The cooling case 13 includes an inlet portion 13c and an outlet portion 13d for the coolant at a center of the longitudinal edge portion. The inlet portion 13c and the outlet portion 13d are connected to the side wall of the cooling case 13 and disposed along a peripheral edge of the rear surface of the metal base plate 12. The inlet portion 13c includes an inlet opening 13e at a bottom surface thereof, and the outlet portion 13d includes an outlet opening 13f at a bottom surface thereof. Such bottom surfaces are disposed at an opposite side relative to the metal base plate 12. The inlet opening 13e and the outlet opening 13f are respectively formed at the bottom surface of the inlet portion 13c and at the bottom surface of the outlet portion 13d, thereby being capable of restraining a height of the cooling case 13 composing the cooling body in comparison with a case when formed at a side surface, which is thus favorable for a power semiconductor module to be mounted in a vehicle with respect to which reduction in size, thickness, and weight is demanded. The inlet portion 13c and the outlet portion 13d may be disposed in such a manner as to be connected to the bottom wall of the cooling case 13.

The cooling case 13 includes the flange 13g1 which is a first flange at an inlet opening 13e side of the inlet portion 13c. Meanwhile, the cooling case 13 includes the flange 13g2 which is a second flange at an outlet opening 13f side of the outlet portion 13d. The flanges 13g1, 13g2 are a substantially elliptical plate and are disposed in such a manner that a major axis direction thereof extends along a long side direction of the metal base plate. The flanges 13g1, 13g2 may be a substantially rhombic plate. The flanges 13g1, 13g2 can be joined by, for example, interposing a washer made of a clad material of a brazing material and an aluminum material around the inlet opening 13e and the outlet opening 13f and brazing the same. Besides the washer, the flanges 13g1, 13g2 may be fixed by bonding. The flanges 13g1, 13g2 are of such a material and structure as to have a sufficient strength for bolt fastening. The flanges 13g1, 13g2 include a main surface at a side distant from the metal base plate 12. Each main surface of the flanges 13g1, 13g2 may be parallel to the front surface of the metal base plate 12 and may be a plane. Further, the flanges 13g1, 13g2 may be disposed at positions at sides opposite to each other to have the cooling case 13 therebetween.

The flange 13g1 includes an opening portion 13eg which is a first opening disposed in such a manner as to be opposed to the inlet opening 13e. The flange 13g2 includes an opening portion 13fg which is a second opening disposed in such a manner as to be opposed to the outlet opening 13f. Further, the flange 13g1 is provided with bolt holes 13h which are a pair of first bolt holes disposed to have the opening portion 13eg therebetween. The flange 13g2 is provided with the bolt holes 13h which are a pair of second bolt holes disposed to have the opening portion 13fg therebetween. Such bolt holes 13h are formed at the same intervals as the through holes 12a provided to the metal base plate 12 and disposed at the same positions as the bolt holes 12a. Such bolt holes 13h also serve as a bolt hole for mounting the power semiconductor module 1 to a flow path member 31 (FIG. 7) and as a bolt hole for connecting the inlet opening and the outlet opening of the power semiconductor module to flow paths of the flow path member 31. The flanges 13g1, 13g2 may be each provided with one or more pair of bolt holes 13h.

A segment between the pair of bolt holes of the flange 13g1 joined to the inlet portion 13c and a segment between the pair of bolt holes of the flange 13g2 joined to the outlet portion 13d are preferably substantially parallel to each other. In the present embodiment as illustrated, the segments extend along the long side direction of the metal base plate so as to be accordingly parallel to each other. The flange 13g1 and the flange 13g2 can be disposed to have the two side walls 13b therebetween from among the four side walls 13b of the cooling case 13.

FIG. 3 illustrates an exploded perspective view of the power semiconductor module 1. The resin case 11 is made of an insulation resin, such as a PPS resin and a urethane resin, and has a frame shape having an opening which penetrates from the upper surface to the bottom surface at a center. To the resin case 11, the external terminals 14A-14E are integrally mounted by insert molding or the like. The through holes 11a can be formed at the time of insert molding.

The metal base plate 12 includes the rectangular front surface and rear surface having substantially the same size as the resin case 11. The metal base plate 12 is made of a metal having a favorable thermal conductivity, such as aluminum or an aluminum alloy, or a composite material (clad material) of such a material and a brazing material. To the front surface of the metal base plate 12, a rear surface of an insulation substrate 15 as a specific example of a multilayer substrate, i.e. a fourth surface is joined by a joining material, such as a solder, a brazing material, or a sintered material.

In the present embodiment as illustrated, the three insulation substrates 15 are aligned in a row along a longitudinal direction at a center in a transverse direction of the metal base plate 12. Each insulation substrate 15 carries the four semiconductor chips 16 on a front surface of one insulation substrate 15, i.e. a third surface. The semiconductor chips 16 according to the present embodiment as illustrated are each an example of a reverse conducting IGBT (RC-IGBT) in which an IGBT and a FWD are integrated into one chip. A total of two pairs of semiconductor chips electrically connected in parallel on one insulation substrate 15 compose an upper arm and a lower arm of one phase composing the inverter circuit. The upper arm is composed of the two semiconductor chips 16A which are first semiconductor elements connected in parallel. The lower arm is composed of the two semiconductor chips 16B which are second semiconductor elements connected in parallel. Then, the three insulation substrates 15 of the metal base plate 12 compose U-phase, V-phase, and W-phase of the inverter circuit. To the semiconductor chip 16 of U-phase, a set of the external terminals 14A, 14D, 14E are electrically connected. To the semiconductor chip 16 of V-phase, a set of the external terminals 14B, 14D, 14E are electrically connected. Further, to the semiconductor chip 16 of W-phase, a set of the external terminals 14C, 14D, 14E are electrically connected. Between the external terminals 14A, 14B, the through hole 11a may be disposed. Between the external terminals 14B, 14C, the through hole 11a may be disposed. Such through holes 11a correspond to the pair of bolt holes 13h of the flange 13g2. Further, between the external terminals 14D, 14E for U-phase and the external terminals 14D, 14E for V-phase, the through hole 11a may be disposed. Between the external terminals 14D, 14E for V-phase and the external terminals 14D, 14E for W-phase, the through hole 11a may be disposed. Such through holes 11a correspond to the pair of bolt holes 13h of the flange 13g1.

If a material of the cooling case 13 is the same as the metal base plate 12, the both can accordingly have the same thermal expansion coefficient, which is preferable. In the substantially rectangular space enclosed by the bottom wall 13a and the side walls 13b, the fins 17 as a heat sink are housed. In an example as illustrated in FIG. 3, the fins 17 have a thin plate shape and a plurality thereof are each disposed at intervals along a transverse direction of the cooling case 13. An upper end of each fin 17 is joined to the rear surface of the metal base plate 12 by brazing. Thereby, heat generated from the semiconductor chip 16 is conducted through the insulation substrate 15 and the metal base plate 12 to the fins 17.

In the space in the cooling case 13, between the inlet portion 13c and the fins, a flow path 13i of the coolant introduced through the inlet opening 13e from the exterior is formed. Meanwhile, between the outlet portion 13d and the fins 17, a flow path 13j for discharging toward the outlet opening 13f the coolant which has flowed though gaps between the fins is formed.

The fins 17 having a thin plate shape are disposed along the transverse direction of the cooling case 13 so that cooling water supplied from the inlet portion 13c passes the flow path 13i to flow through the gaps between the fins 17 and passes the flow path 13j to be discharged from the outlet opening 13f of the outlet portion 13d.

Figure 4:
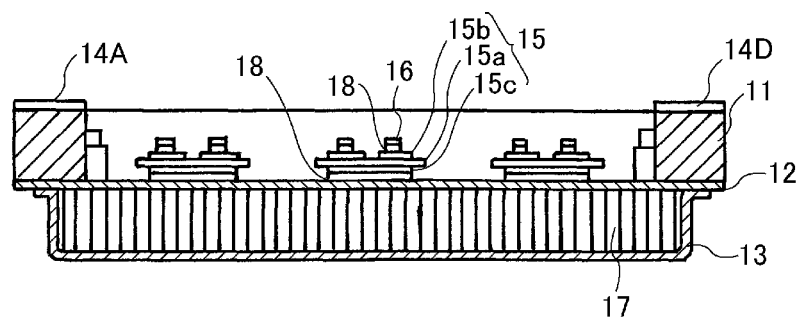
FIG. 4 is a cross-sectional view along line IV-IV of FIG. 1.

FIG. 4 illustrates a cross-sectional view along line IV-IV of FIG. 1. The insulation substrate 15 is formed by adhering a ceramic insulation plate 15a, a circuit plate 15b selectively formed on a front surface of such ceramic insulation plate 15a and made of a copper foil or the like, and a metal plate 15c formed on a rear surface of such ceramic insulation plate 15a and made of a copper foil or the like to each other. Joining of the circuit plate 15b and the semiconductor chip 16 is made, for example, by a solder 18 as a joining material. Joining of the metal plate 15c and the metal base plate 12 is made, for example, by the solder 18 as a joining material. As the joining material, a brazing material and a sintered material may be also used. The insulation substrate 15 and the semiconductor chip 16 in the resin case 11 are sealed by a sealing material made of an insulation resin, such as an epoxy resin, or an insulation gel, such as a silicone, to enhance insulation properties. Note that in FIG. 4, illustration of a bonding wire electrically connected to an electrode provided on a surface of the semiconductor chip 16 and the like is omitted. Moreover, in FIG. 4, illustration of the sealing material injected into a frame of the resin case 11 and a cover attached to the upper surface of the resin case 11 is also omitted.

Figure 5:
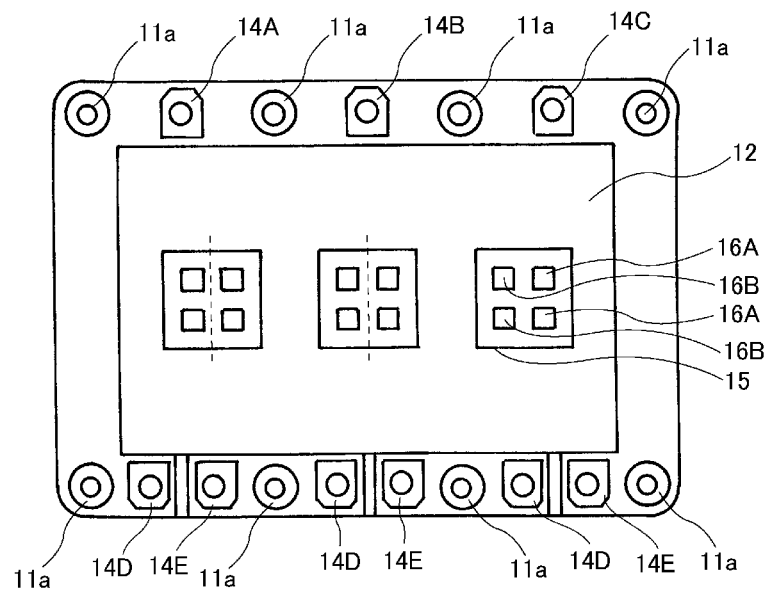
FIG. 5 is a plan view of the power semiconductor module of FIG. 1.
Figure 6:
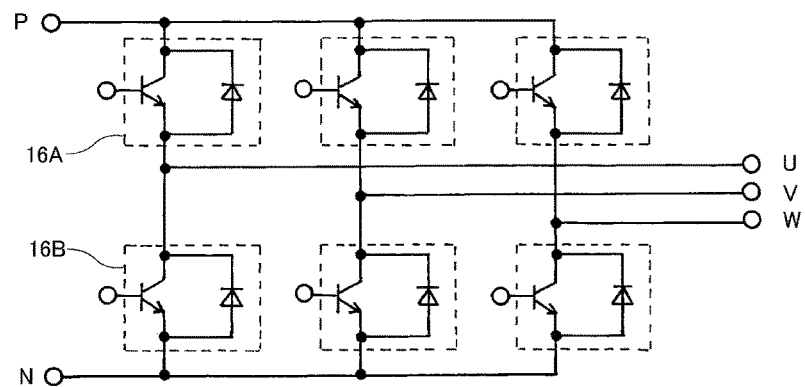
FIG. 6 is a circuit diagram of an inverter circuit of the power semiconductor module of FIG. 1.

FIG. 5 illustrates a plan view of the power semiconductor module 1 of FIG. 1. Note that to facilitate understanding, the plan view illustrates a state in which the cover, the sealing material, and the boding wire are unillustrated and the insulation substrate 15 and the semiconductor chip 16 disposed in the resin case 11 are shown. The power semiconductor module 1 is, as described above, a 6-in-1 type power semiconductor module which composes the inverter circuit. Such an inverter circuit is illustrated in FIG. 6. The four semiconductor chips 16 joined to one insulation substrate 15 compose, as described above, the upper arm and the lower arm of one phase. Further specifically, in FIG. 5, the two semiconductor chips 16A and the semiconductor chips 16B disposed along the transverse direction of the metal base plate 12 compose the upper arm and the lower arm, respectively. The two semiconductor chips 16A corresponding to the upper arm are disposed along a movement direction of the coolant flowing between the fins 17 directly under the metal base plate 12. The two semiconductor chips 16B corresponding to the lower arm are also similarly disposed along the movement direction of the coolant. Thereby, a cooling efficiency of the semiconductor chips 16A composing the upper arm and a cooling efficiency of the semiconductor chips 16B composing the lower arm can be configured to be equal.

The power semiconductor module 1 according to the present embodiment includes the flanges 13g1, 13g2 respectively at the inlet portion 13c and the outlet portion 13d of the cooling case 13 so as to be capable of being connected to a member including an external flow path, i.e. a flow path member 31 without using a pipe. Thus, even as a power semiconductor module to be mounted in a vehicle with a limited space for mounting, mounting the power semiconductor module can be easily made. Further, since no pipe nor hose is used, no stress is applied to a connection portion and the cooling body due to arrangement of a pipe and a hose, and a decrease in reliability can be prevented.

The flange 13g1 is provided with the pair of bolt holes 13h disposed to have the opening portion 13eg connected to the inlet opening 13e therebetween. The flange 13g2 is also provided with the pair of bolt holes 13h disposed to have the opening portion 13fg connected to the outlet opening 13f therebetween. Such bolt holes 13h are disposed at the same intervals and at the same positions as the through holes 11a of the resin case 11 and the bolt holes 12a of the metal base plate 12. The bolt holes 13h, the through holes 11a, and the bolt holes 12a may be disposed in such a manner that bolts can penetrate from an upper surface to a bottom surface of the power semiconductor module 1 in a thickness direction. Preferably, the three types of holes may be disposed in such a manner that respective axes of the bolt holes 13h, the through holes 11a, and the bolt holes 12a are coaxial. A cross-sectional shape of each hole is a circle, an oval, an ellipse, or the like, and is preferably a circle.

The bolt holes 13h, the through holes 11a, and the bolt holes 12a are thus disposed, whereby the power semiconductor module can be fastened to the flow path member 31 by the bolts and the inlet opening 13e and the outlet opening 13f can be connected to the flow paths of the flow path member 31 so that labor of a mounting operation can be reduced and the number of bolts can be reduced. Moreover, a rigidity when the power semiconductor module 1 is mounted can be improved. Further, a total area of an area for fixing the power semiconductor module 1 and an area for connecting the flow path can be reduced so that reduction in size of the power semiconductor module 1 can be achieved.

The flanges 13g1, 13g2 are provided with one or more pair of bolt holes 13h to have the opening portion 13eg connected to the inlet opening 13e or the opening portion 13fg connected to the outlet opening 13f therebetween, whereby a bolt fastening force for connecting the inlet opening 13e and the outlet opening 13f to the flow paths of the flow path member evenly applies to the vicinity of the inlet opening 13e and the outlet opening 13f so that leakage in the vicinity of the inlet opening 13e and the outlet opening 13f can be prevented.

In the present embodiment, the flanges 13g1, 13g2 are disposed at a bottom surface side of the inlet portion 13c and a bottom surface side of the outlet portion 13d, respectively. In the power semiconductor module of a type of thus circulating the coolant from a bottom surface side of the cooling case 13, a height can be reduced, which is advantageous for reduction in thickness.

In the present embodiment as illustrated, an example in which a head end of the inlet portion 13c and a head end of the outlet portion 13d are respectively provided with the flange 13g1 and the flange 13g2 is illustrated, which is, however, not to exclude members other than the flanges, and an attachment having a function similar to that of the flanges may be employed.

Second Embodiment

Figure 7:
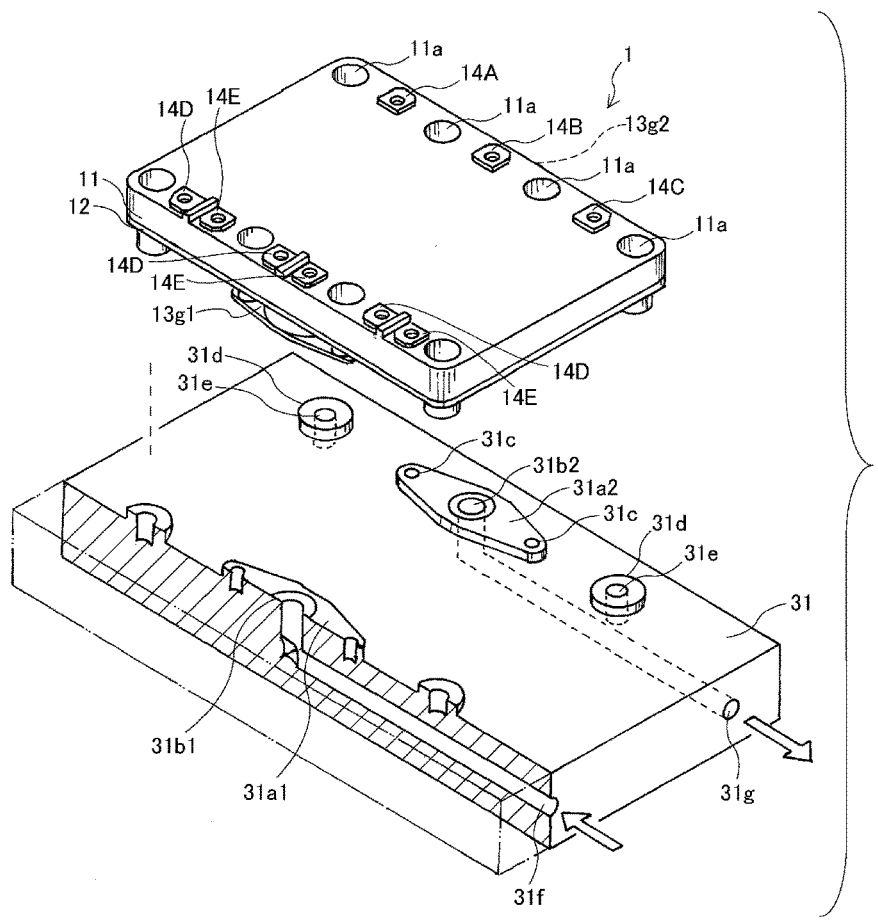
FIG. 7 is a perspective view of an embodiment of a flow path member of the present invention.

The flow path member 31 to which the power semiconductor module 1 according to the first embodiment is mounted will be described with reference to FIG. 7. FIG. 7 is a perspective view of the power semiconductor module 1 and the flow path member 31. A cross-section is partially illustrated. In FIG. 7, the power semiconductor module 1 can be the same as the power semiconductor module 1 as illustrated in FIGS. 1-6. Accordingly, in FIG. 7, the power semiconductor module 1 and a member thereof are assigned the same symbols as those in FIGS. 1-6, and repetitive description will be hereinafter omitted.

The flow path member 31 is substantially a rectangular prism in the present embodiment as illustrated in FIG. 7 and is mounted in such a manner that the bottom face of the cooling case 13 of the power semiconductor module 1 faces an upper surface thereof. On the upper surface of the flow path member 31, a protrusion portion 31a1 which abuts the flange 13g1 of the power semiconductor module 1, a protrusion portion 31a2 which abuts the flange 13g2, and a protrusion portion 31d which abuts a projection portion including the bolt hole 12a of the metal base plate 12 are formed. Note that such protrusion portions 31a1, 31a2, 31d are unrequired for the upper surface of the flow path member 31. A portion of the flat upper surface of the flow path member 31 at which the flange 13g1 of the power semiconductor module 1 abuts may be a first connection portion. Similarly, a portion of the flat upper surface of the flow path member 31 at which the flange 13g2 abuts may be a second connection portion. Moreover, the projection portion including the bolt hole 12a of the metal base plate 12 may be configured to abut the flat upper surface of the flow path member 31. Further, in place of the protrusion portions 31a1, 31a2, 31d, a protrusion portion having such a shape as to be capable of being fitted to a cylindrical member coaxially connected to the flanges 13g1, 13g2 and the bolt holes 12a may be employed.

The protrusion portion 31a1 abutting the flange 13g1 is provided with an opening 31b1 of an introduction flow path 31f for the coolant which is formed in the interior of the flow path member 31 and is connected through the opening portion 13eg of the flange 13g1 to the inlet opening 13e. Similarly, the protrusion portion 31a2 abutting the flange 13g2 is provided with an opening 31b2 of a discharge flow path 31g for the coolant and is connected through the opening portion 13fg of the flange 13g2 to the outlet opening 13f. The introduction flow path 31f and the discharge flow path 31g for the coolant can be optionally disposed in the interior of the flow path member 31. To prevent leakage, between the flange 13g1 and the protrusion portion 31a1 and between the flange 13g2 and the protrusion portion 31a2, an O-ring is preferably disposed. Moreover, a groove for attaching such an O-ring is preferably provided to a surface of the protrusion portions 31a1, 31a2.

The protrusion portion 31a1 is provided with a pair of nuts 31c for fastening a bolt to have the opening 31b1 therebetween. The protrusion portion 31a2 is also similarly provided with the pair of nuts 31c to have the opening 31b2 therebetween. Moreover, the protrusion portion 31d is provided with a nut 31e for fastening a bolt. The pair of protrusion portions 31d are disposed to have the protrusion portion 31a1 therebetween and the nuts 31c and the nuts 31e are aligned. Similarly, the pair of protrusion portions 31d are disposed to have the protrusion portion 31a2 therebetween. Such nuts 31c, 31e are disposed in such a manner as to face the through holes 11a of the resin case 11 of the power semiconductor module 1, the bolt holes 12a of the metal base plate 12, and the bolt holes 13h of the cooling case 13. The bolts as penetrating such bolt holes and the nuts are screw-connected, whereby the power semiconductor module 1 is fixed to the flow path member 31 and the inlet opening 13e and the outlet opening 13f of the power semiconductor module 1 are respectively connected to the opening 31b1 of the introduction flow path 31f and the opening 31b2 of the discharge flow path 31g of the flow path member 31.

The flow path member 31 is substantially a rectangular prism in an example as illustrated in FIG. 7, but may have any such shape as to be capable of mounting the power semiconductor module 1. Further, the flow path member 31 is not limited to an independent member including the introduction flow path 31f and the discharge flow path 31g for the coolant, but may be a part of a member for cooling an engine member or an engine of a vehicle.

The flow path member 31 is combined with the power semiconductor module 1 according to the first embodiment so that the power semiconductor module 1 can be mounted without using a pipe or labor of a mounting operation can be reduced.

Third Embodiment

Figure 8:
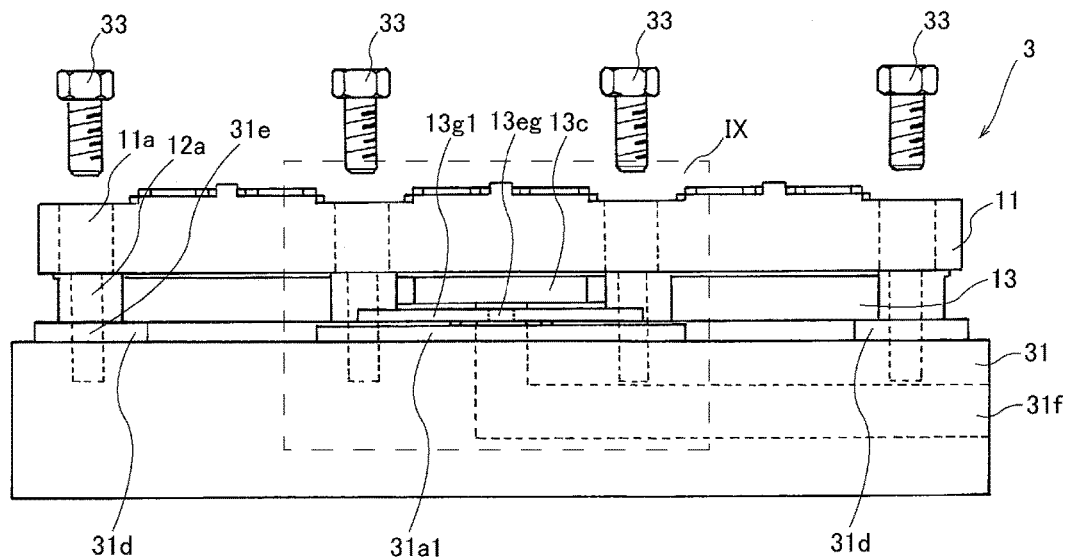
FIG. 8 is a front view of an embodiment of a power-semiconductor-module structure of the present invention.
Figure 9:
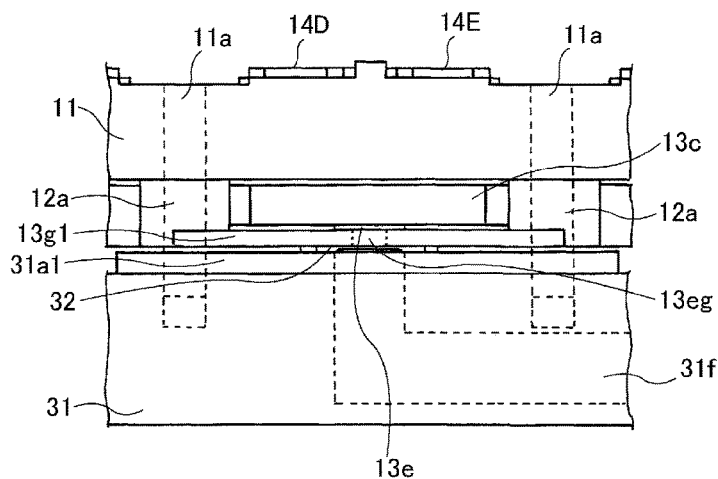
FIG. 9 is a partially enlarged view of the power-semiconductor-module structure of FIG. 8.

A power-semiconductor-module structure 3 consisting of the power semiconductor module 1 according to the first embodiment and the flow path member 31 according to the second embodiment will be described with reference to FIGS. 8 and 9. FIG. 8 is a front view of the power-semiconductor-module structure 3, and FIG. 9 is a partially enlarged view of section IX of FIG. 8. Note that in FIGS. 8 and 9, the power semiconductor module 1 and the flow path member 31 are assigned the same symbols as those in FIGS. 1-7, and repetitive description will be hereinafter omitted.

The power-semiconductor-module structure 3 as illustrated in FIGS. 8 and 9 consists of the power semiconductor module 1 and the flow path member 31 according to the second embodiment which are fastened by bolts 33. As illustrated in FIG. 9, between the flange 13g1 and the protrusion portion 31a1, an O-ring 32 is disposed, thereby preventing leakage. Although unillustrated, also between the flange 13g2 and the protrusion portion 31a2, the O-ring 32 is disposed. Preferably, a surface of the protrusion portions 31a1, 31a2 are provided with a groove, and the O-ring 32 is stored in such a groove.

The power-semiconductor-module structure 3 according to the present embodiment is used so that the power semiconductor module 1 can be mounted without using a pipe or labor of a mounting operation can be reduced.

Fourth Embodiment

Figure 10:
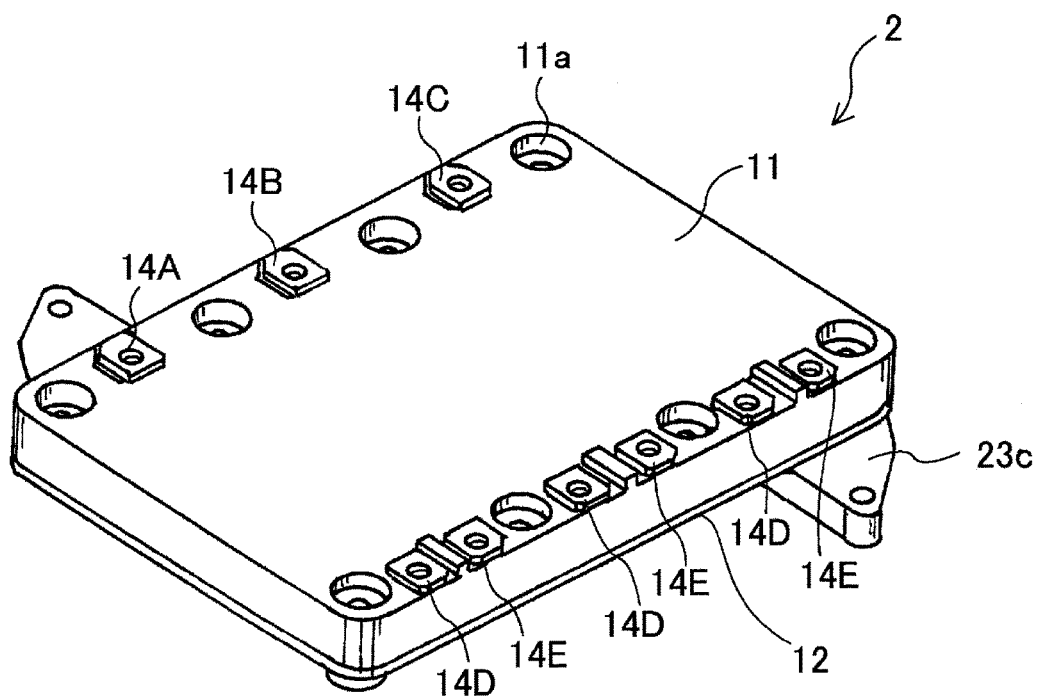
FIG. 10 A is a perspective view of an appearance of another embodiment of the power semiconductor module of the present invention as seen from above.
Figure 10:
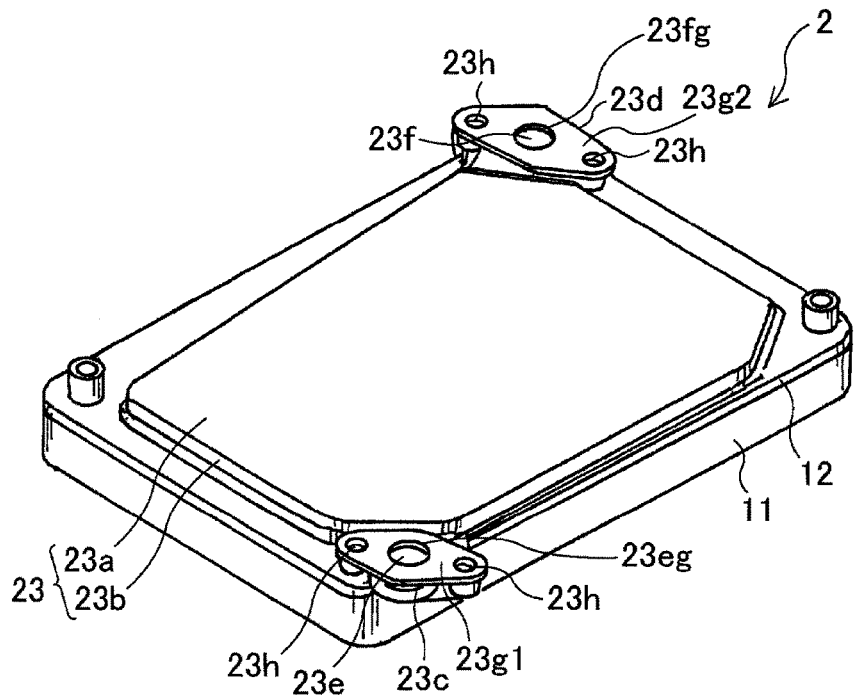

A power semiconductor module 2 according to another embodiment of the present invention will be described with reference to FIGS. 10 A and 10 B. FIG. 10 A is a perspective view of the power semiconductor module 2 as seen from obliquely above, and FIG. 10 B is a perspective view of the power semiconductor module 2 as seen from a rear surface side.

The power semiconductor module 2 as illustrated in FIGS. 10 A and 10 B differs from the power semiconductor module 1 as illustrated in FIGS. 1 and 2 in that in a cooling case 23 including a bottom wall 23a and side walls 23b, an inlet portion 23c and an outlet portion 23d for a coolant are positioned in the vicinity of corner portions at opposite angles of the metal base plate 12. At a head end of an inlet opening 23e of the inlet portion 23c and an outlet opening 23f of the outlet portion 23d, flanges 23g1, 23g2 are respectively provided. The flanges 23g1, 23g2 respectively include opening portions 23eg, 23fg, and further include a pair of bolt holes 23h disposed to have the opening portion 23eg therebetween and the pair of bolt holes 23h disposed to have the opening portion 23fg therebetween. One bolt hole 23h of the flange 23g1 is disposed relative to the through hole 11a and the bolt hole 12a such that the bolt can penetrate from the upper surface toward the bottom surface of the power semiconductor module 1 in the thickness direction. One bolt hole 23h of the flange 23g2 is also similarly disposed.

In the power semiconductor module 2 according to the present embodiment, similarly to the power semiconductor module 1 according to the first embodiment, the head end of the inlet portion 23c and the head end of the outlet portion 23d of the cooling case 23 are respectively provided with the flange 23g1 and the flange 23g2 so that connection to the flow path member suitable for a position of the head end of the inlet portion 23c and the outlet portion 23d of the power semiconductor module 2 can be made. Thus, even as a power semiconductor module to be mounted in a vehicle with a limited space for mounting, mounting the power semiconductor module can be easily made.

As understood from the power semiconductor module 2 according to the present embodiment and the power semiconductor module 1 according to the first embodiment, in the power semiconductor module of the present invention, the position of the inlet portion and the outlet portion of the cooling case provided with the flanges is not particularly limited.

Comparative Embodiment

Figure 11:
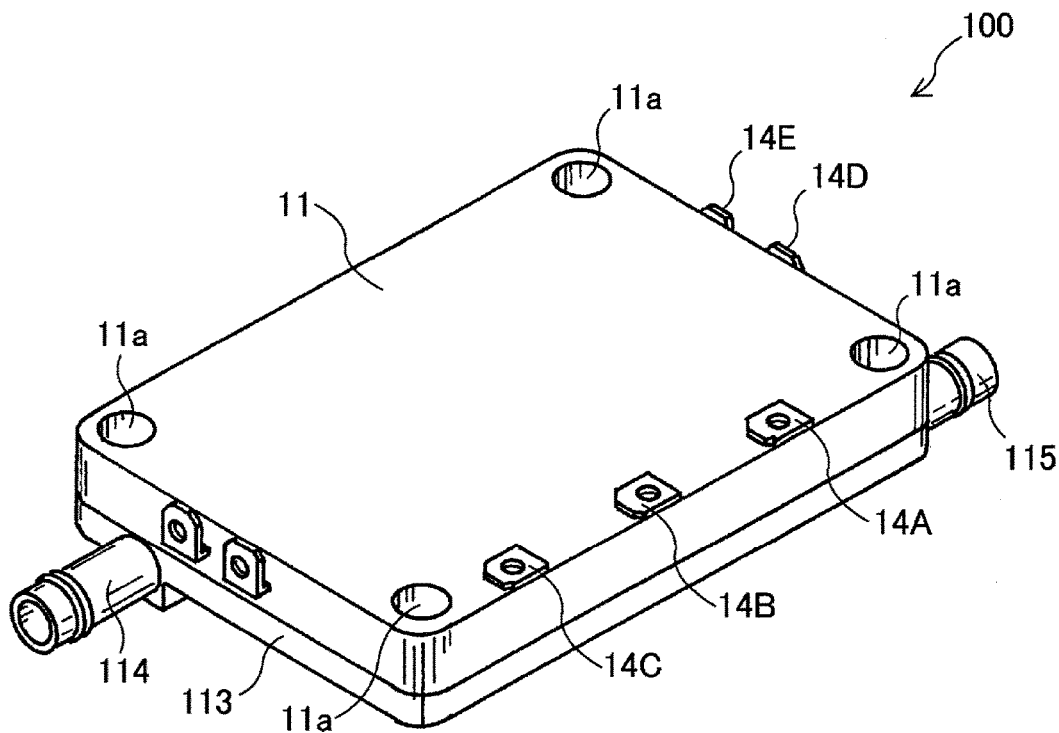
FIG. 11 A is a perspective view of an appearance of a conventional power semiconductor module as seen from above.
Figure 11:
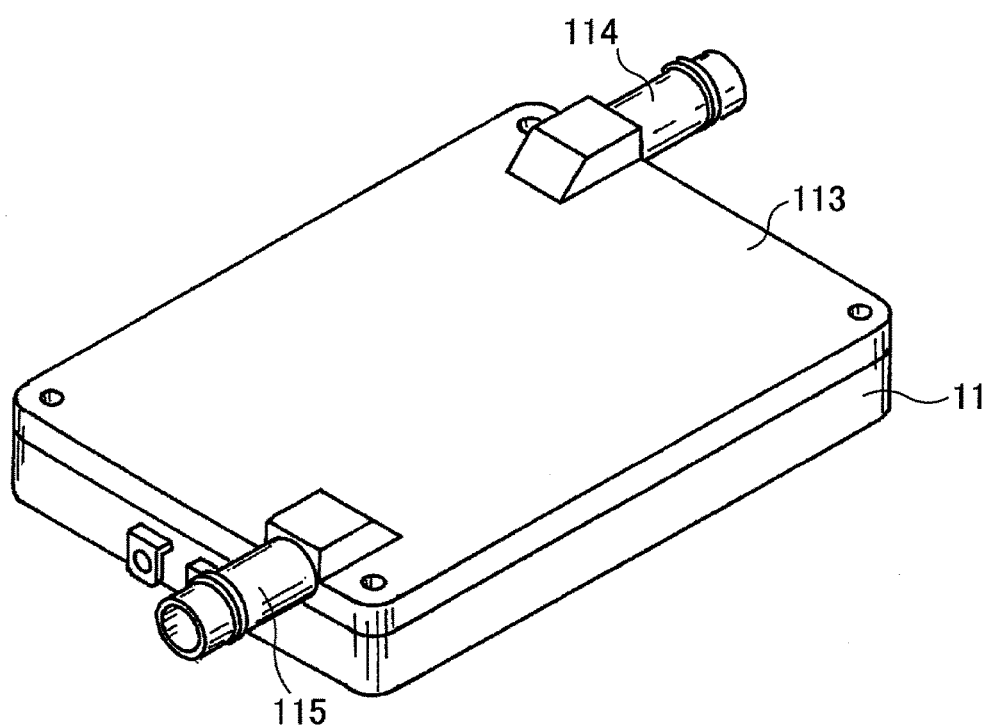

For comparison, a conventional power semiconductor module 100 is illustrated in FIGS. 11 A and 11 B. FIG. 11 A is a perspective view of an appearance of the power semiconductor module 100 as seen from above, and FIG. 11B is a perspective view of the appearance of the power semiconductor module 100 as seen from a rear surface.

In the conventional power semiconductor module 100, to a cooling body 113, a pipe 114 at an introduction side and a pipe 115 at a discharge side are attached. There have been cases that in the power semiconductor module 100 provided with such pipe 114 and pipe 115, an operation of mounting the same and an operation of attaching a hose to the pipe 114 and the pipe 115 are not easy. Further, an operation of mounting the power semiconductor module 100 and an operation of attaching a hose to the pipe 114 and the pipe 115 are separate so that the operations require much labor.

By contrast of the conventional power semiconductor module 100 as illustrated in FIGS. 11A and 11B and the power semiconductor modules 1, 2 according to the first and fourth embodiments of the present invention as described above, effects of the invention are clear.

Fifth Embodiment

Figure 12:
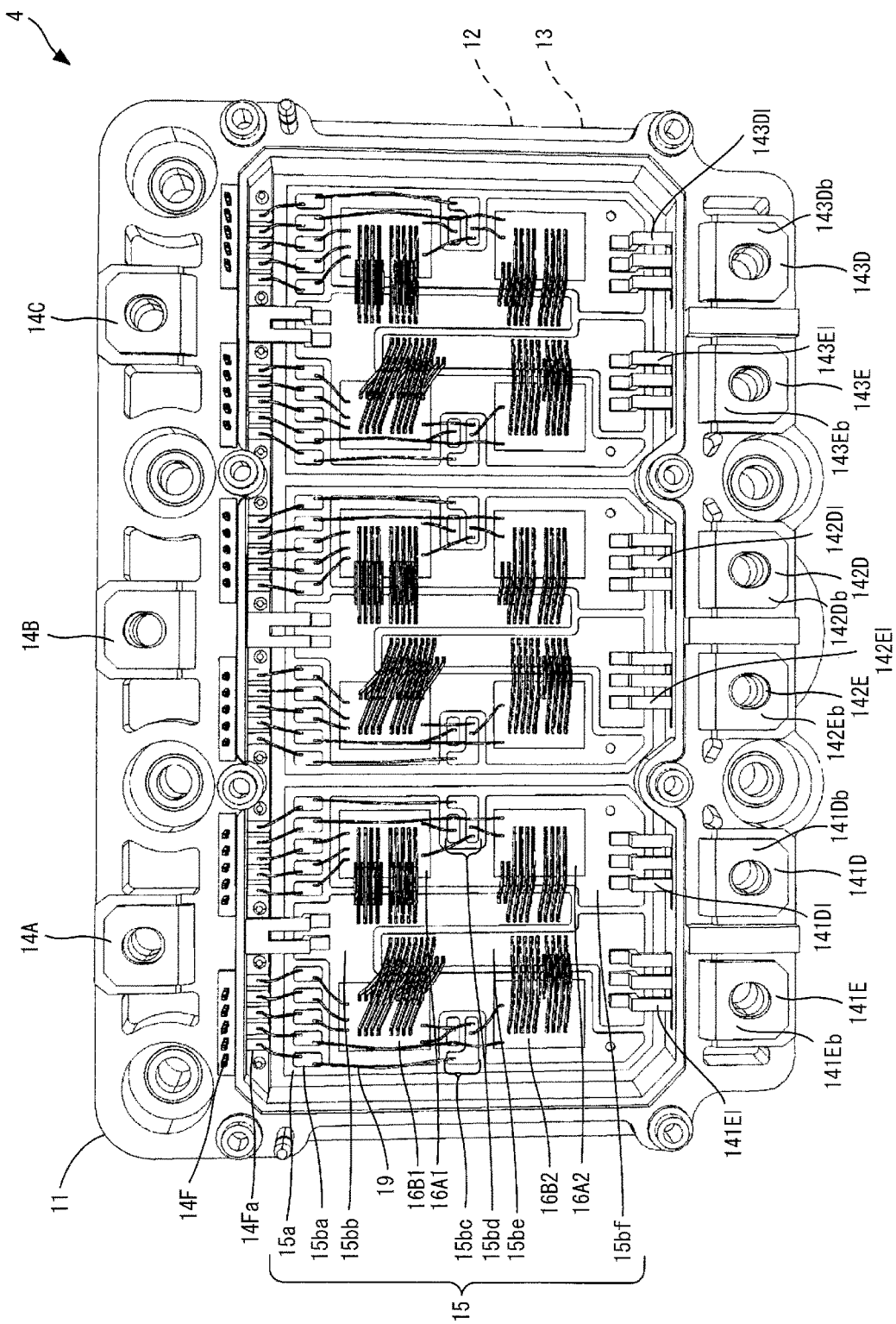
FIG. 12 is a plan view of an embodiment of the power semiconductor module of the present invention.

FIG. 12 illustrates a plan view of a power semiconductor module 4. Note that to facilitate understanding, the plan view illustrates a state in which the cover and the sealing material are unillustrated and the insulation substrate 15 and semiconductor chips 16A1, 16A2, 16B1, 16B2 disposed in the resin case 11 are shown. Similarly to the power semiconductor module 1 as illustrated in FIGS. 1-3, a configuration lower than the resin case 11 can include the metal base plate 12 and the cooling case 13. Specifically, to the bottom surface of the resin case 11, the front surface of the metal base plate 12 is bonded, and to the rear surface of the metal base plate 12, the cooling case 13 is joined. It can be configured that the fins disposed in the cooling case 13 have a thin plate shape and a plurality thereof are each disposed at intervals along the transverse direction of the cooling case 13.

The resin case 11 is made of an insulation resin, such as a PPS resin and a urethane resin, and has a frame shape having an opening which penetrates from the upper surface to the bottom surface at an opposite side at a center. Herein, the upper surface is at a front side of the drawing and the bottom surface is at a back side of the drawing. This is similar to the power semiconductor module 1 as illustrated in FIGS. 1-3. To the resin case 11, external terminals 14A, 14B, 14C, 141D, 141E, 142D, 142E, 143D, and 143E are integrally mounted by insert molding or the like. The external terminal 14A is a U-terminal, the external terminal 14B is a V-terminal, the external terminal 14C is a W-terminal, the external terminals 141D, 142D, 143D are a positive terminal (P-terminal), and the external terminals 141E, 142E, 143E are a negative terminal (N-terminal).

The metal base plate 12 includes the rectangular front surface and rear surface at an opposite side having substantially the same size as the resin case 11. The metal base plate 12 is made of a metal having a favorable thermal conductivity, such as aluminum or an aluminum alloy, or a composite material (clad material) of such a material and a brazing material. To the front surface of the metal base plate 12, a rear surface of an insulation substrate 15 as a specific example of a multi-layer substrate, i.e. a fourth surface is joined by a joining material, such as a solder, a brazing material, or a sintered material.

In the insulation substrate 15, a lower surface of the ceramic insulation plate 15a is provided with a metal plate (illustration omitted) and an upper surface of the ceramic insulation plate 15a is provided with circuit plates 15ba, 15bb, 15bc, 15bd, 15be, 15bf. Further, on the circuit plate 15*bf*, the semiconductor chips 16A1, 16A2 are disposed through a solder. Moreover, on the circuit plate 15*bb*, the semiconductor chips 16B1, 16B2 are disposed through a solder.

Such insulation substrate 15 is housed in an opening of the resin case 11. An electrode portion 14Fa which is one end of a control terminal 14F, the circuit plates 15*ba*, 15*bc*, 15*bd*, and a control electrode provided on a front surface of the semiconductor chips 16A1, 16A2, 16B1, 16B2 as exposed in the opening of the resin case 11 are connected to each other by a wire 19.

Moreover, a main electrode provided on a front surface of the semiconductor chips 16A1, 16A2 on the circuit plate 15*bf* and a circuit plate 15*bb* are connected by the wire 19. A main electrode provided on a front surface of the semiconductor chips 16B1, 16B2 on the circuit plate 15*bb* and a circuit plate 15*be* are connected by the wire 19.

Figure 13:
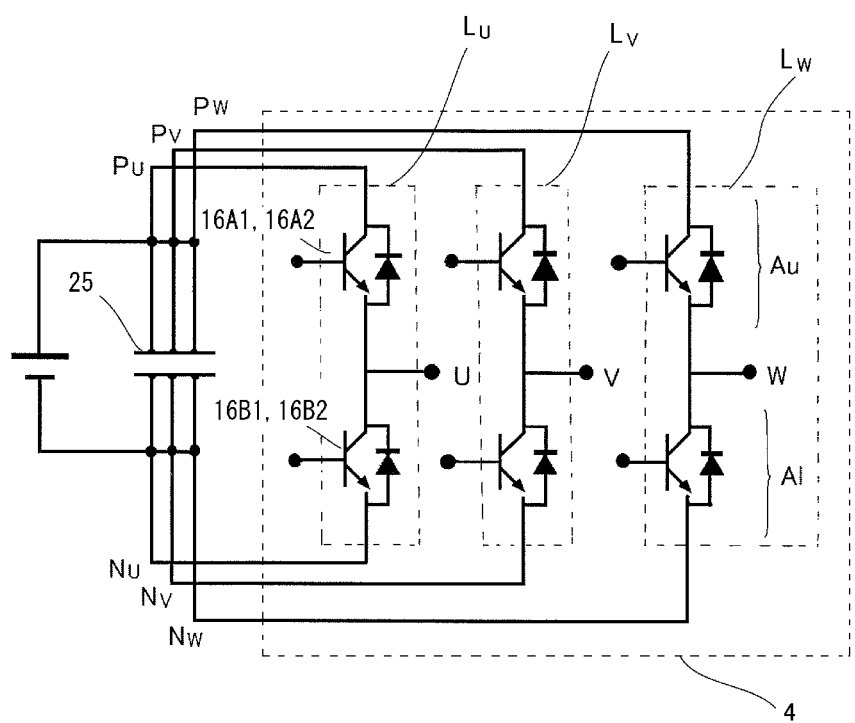
FIG. 13 is a circuit diagram of an inverter circuit of the power semiconductor module of FIG. 12.

The power semiconductor module 4 is a 6-in-1 type power semiconductor module which composes the inverter circuit. An example of such an inverter circuit is illustrated in FIG. 13.

The four semiconductor chips 16A1, 16A2, 16B1, 16B2 joined to one insulation substrate 15 compose a pair of an upper arm Au and a lower arm A1 of one phase, i.e. a leg. Further specifically, in FIG. 12, two pieces of the semiconductor chips 16A1 and the semiconductor chip 16A2 and the semiconductor chip 16B1 and the semiconductor chip 16B2 disposed along the transverse direction of the metal base plate 12 compose the upper arm Au and the lower arm A1 of one phase composing the inverter circuit, for example, U-phase, respectively. The two pieces of the semiconductor chip 16A1 and the semiconductor chip 16A2 corresponding to the upper arm Au are disposed along a movement direction of the coolant flowing between the fins 17 directly under the metal base plate 12. The two pieces of the semiconductor chip 16B1 and the semiconductor chip 16B2 corresponding to the lower arm A1 are also similarly disposed along the movement direction of the coolant. Thereby, a cooling efficiency of the semiconductor chip 16A1 and the semiconductor chip 16A2 composing the upper arm Au and a cooling efficiency of the semiconductor chip 16B1 and the semiconductor chip 16B2 composing the lower arm A1 can be configured to be equal.

In the power semiconductor module 4, the three insulation substrates 15 are aligned in a row along the longitudinal direction at a center in the transverse direction of the metal base plate 12. Each insulation substrate 15 carries the four semiconductor chips 16A1, 16A2, 16B1, 16B2 on the front surface of one insulation substrate 15, i.e. the third surface. The semiconductor chips 16A1, 16A2, 16B1, 16B2 according to the present embodiment as illustrated are each an example of a reverse conducting IGBT (RC-IGBT) in which an IGBT and a FWD are integrated into one chip. A total of two pairs of semiconductor chips electrically connected in parallel on one insulation substrate 15 compose the upper arm Au and the lower arm A1 of one phase composing the inverter circuit. The upper arm Au is composed of the two pieces of the semiconductor chip 16A1 and the semiconductor chip 16A2 which are the first semiconductor elements connected in parallel on the circuit plate 15*bf*. The lower arm A1 is composed of the two pieces of the semiconductor chip 16B1 and the semiconductor chip 16B2 which are the second semiconductor elements connected in parallel on the circuit plate 15*bb*. Then, the three insulation substrates 15 of the metal base plate compose U-phase, V-phase, and W-phase of the inverter circuit.

U-phase, V-phase, and W-phase include a leg $L_u$, a leg $L_v$, and a leg $L_w$ which are a pair of the upper arm Au and the lower arm A1, respectively. Each of the leg $L_u$, the leg $L_v$, and the leg $L_w$ includes the insulation substrate 15, the first semiconductor elements composing the upper arm Au and the second semiconductor elements composing the lower arm A1, and a power supply terminal which supplies power to the first semiconductor elements and the second semiconductor elements.

If a specific phase from among U-phase, V-phase, and W-phase and a phase different from the specific phase are distinctively described, the specific phase includes a first pair (leg) consisting of the upper arm and the lower arm, and the phase different from the specific phase includes a second pair (leg) consisting of the upper arm and the lower arm. If the specific phase from among U-phase, V-phase, and W-phase, for example, U-phase and the phase different from the specific phase, for example, V-phase are distinguished, the insulation substrate 15 of the first leg is referred to as a first multi-layer substrate and the insulation substrate 15 of the second leg is referred to as a second multi-layer substrate. Similarly, as carried on the first multi-layer substrate, the semiconductor elements composing the upper arm are referred to as first semiconductor elements and the semiconductor elements consisting of the upper arm are referred to as second semiconductor elements. As carried on the second multi-layer substrate, the semiconductor elements composing the upper arm are referred to as third semiconductor elements and the semiconductor elements composing the upper arm are referred to as fourth semiconductor elements. The power supply terminal supplying power to the first semiconductor elements and the second semiconductor elements is referred to as a first power supply terminal and the power supply terminal supplying power to the third semiconductor elements and the fourth semiconductor elements is referred to as a second power supply terminal.

The power semiconductor module 4 according to the present embodiment includes a first pair consisting of the upper arm and the lower arm and a second pair consisting of the upper arm and the lower arm. The first pair at least includes the first multi-layer substrate as the multi-layer substrate, the first semiconductor elements composing the upper arm and the second semiconductor elements composing the lower arm as the semiconductor element, and the first power supply terminal supplying power to the first semiconductor elements and the second semiconductor elements. The second pair at least includes the second multi-layer substrate as the multi-layer substrate, the third semiconductor elements composing the upper arm and the fourth semiconductor elements composing the lower arm as the semiconductor element, and the second power supply terminal supplying power to the third semiconductor elements and the fourth semiconductor elements.

Further specifically, as illustrated in FIG. 12, the power supply terminals of the legs for U-phase may each include the positive terminal 141D capable of being connected to a positive side of an external power source and the negative terminal 141E capable of being connected to a negative side of the external power source. The power supply terminals of the legs for V-phase may each include the positive terminal 142D capable of being connected to the positive side of the external power source and the negative terminal 142E capable of being connected to the negative side of the external power source. Moreover, the power supply terminals of the legs for W-phase may each include the positive terminal 143D capable of being connected to the positive side of the external power source and the negative terminal 143E capable of being connected to the negative side of the external power source.

For example, if the leg $L_u$ for U-phase is set as the first leg and either of the leg $L_v$ for V-phase or the leg $L_w$ for W-phase, for example, the leg $L_v$ for V-phase is set as the second leg, the positive terminal 141D is a first positive terminal, the negative terminal 141E is a first negative terminal, the positive terminal 143D is a second positive terminal, and the negative terminal 142E is a second negative terminal.

The positive terminal 141D for U-phase, the positive terminal 142D for V-phase, and the positive terminal 143D for W-phase are different from and independent of each other and may have the same shape. Meanwhile, the negative terminal 141E for U-phase, the negative terminal 142E for V-phase, and the negative terminal 143E for W-phase are different from and independent of each other and may have the same shape. The positive terminal 141D for U-phase, the positive terminal 142D for V-phase, and the positive terminal 143D for W-phase may have the same size, and the negative terminal 141E for U-phase, the negative terminal 142E for V-phase, and the negative terminal 143E for W-phase may have the same size.

The positive terminal 141D for U-phase includes a body portion 141Db and a leg portion 141D1. The positive terminal 142D for V-phase includes a body portion 142Db and a leg portion 142D1. The positive terminal 143D for W-phase includes a body portion 143Db and a leg portion 143D1. In an example as illustrated in FIG. 12, the leg portions 141D1, 142D1, 143D1 each include three ribbon-shaped member and the ribbon-shaped members are connected to the body portions 141Db, 142Db, 143Db. At each terminal, the three ribbon-shaped members are provided in parallel.

The negative terminal 141E for U-phase includes a body portion 141Eb and a leg portion 141E1. The negative terminal 142E for V-phase includes a body portion 142Eb and a leg portion 142E1. The negative terminal 143E for W-phase includes a body portion 143Eb and a leg portion 143E1. In the example as illustrated in FIG. 12, the leg portions 141E1, 142E1, 143E1 each include three ribbon-shaped member and the ribbon-shaped members are connected to the body portions 141Eb, 142Eb, 143Eb. At each terminal, the three ribbon-shaped members are provided in parallel.

The ribbon-shaped members of the positive terminal 141D for U-phase, i.e. an extending direction of the leg portion 141D1 and the ribbon-shaped members of the negative terminal 141E for U-phase, i.e. an extending direction of the leg portion 141E1 may be arranged in parallel. An extending direction of the leg portion 142D1 of the positive terminal 142D for V-phase and the leg portion 142E1 of the negative terminal 142E for V-phase may be also similarly arranged in parallel. An extending direction of the leg portion 143D1 of the positive terminal 143D for W-phase and the leg portion 143E1 of the negative terminal 143E for W-phase may be also similarly arranged in parallel. Further, the positive terminal 141D for U-phase, the positive terminal 142D for V-phase, and the positive terminal 143D for W-phase may be arranged in such a manner that an extending direction of the leg portion 141D1 and an extending direction of the leg portion 142D1 and the leg portion 143D1 are parallel to each other. Further, the negative terminal 141E for U-phase, the negative terminal 142E for V-phase, and the negative terminal 143E for W-phase may be arranged in such a manner that an extending direction of the leg portion 141E1 and an extending direction of the leg portion 142E1 and the leg portion 143E1 are parallel to each other.

The extending directions of the leg portions of the power supply terminals are parallel to each other so that the inductance can be reduced.

To the respective power supply terminals of the legs $L_u$, $L_v$, $L_w$, a capacitor, such as a film capacitor may be connected. An independent film capacitor or a common film capacitor may be connected each between the positive terminal 141D and negative terminal 141E for U-phase, between the positive terminal 142D and negative terminal 142E for V-phase, and between the positive terminal 143D and negative terminal 143E for W-phase. In the circuit diagram as illustrated in FIG. 13, a common film capacitor 25 is connected.

Figure 14:
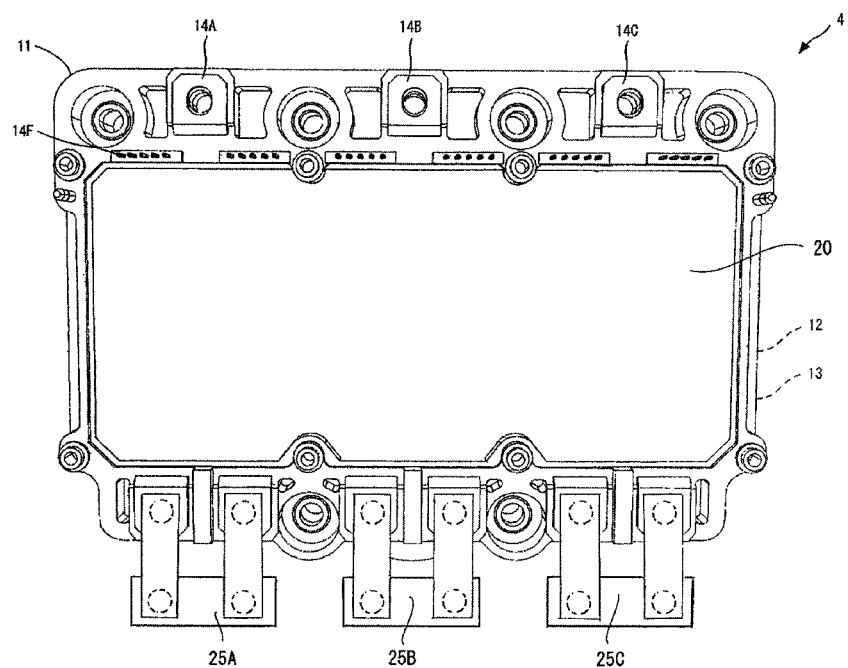
FIG. 14 is a plan view of an embodiment of the power semiconductor module of the present invention.

Further, in the power semiconductor module 4 as illustrated by the plan view of FIG. 14, between the positive terminal 141D and negative terminal 141E for U-phase, a film capacitor 25A is provided, between the positive terminal 142D and negative terminal 142E for V-phase, a film capacitor 25B is provided, and between the positive terminal 143D and negative terminal 143E for W-phase, a film capacitor 25C is provided. The film capacitor 25A, the film capacitor 25B, and the film capacitor 25C as illustrated are each an independent film capacitor. The film capacitor 25A, the film capacitor 25B, and the film capacitor 25C may be housed in a case or the like to be integrated. Note that the plan view of FIG. 14 illustrates an embodiment in which the interior of the resin case 11 of the power semiconductor module 4 as illustrated in FIG. 12 is sealed by a sealing material and an upper end of the opening of the resin case 11 is covered by a cover 20.

The capacity of the capacitors is preferably 100 μF to 3000 μF in total, further preferably 400 μF to 600 μF in total.

In the power semiconductor module 4 according to the present embodiment, the leg of each phase independently includes the power supply terminal consisting of the positive terminal and the negative terminal so that in comparison with a conventional power semiconductor module including one positive terminal common to U-phase, V-phase, and W-phase and one negative terminal common to U-phase, V-phase, and W-phase, a spike voltage generated during an inverter operation can be reduced. Further specifically, in a conventional power semiconductor module including a three-phase inverter circuit in which a smoothing capacitor is connected between a positive terminal and a negative terminal, a spike voltage is superimposed between the positive terminal and the negative terminal to be generated at the time of turn-off of a specific phase and another phase. In contrast, in the power semiconductor module 4 according to the present embodiment, a pair of the positive terminal and the negative terminal are independently provided to each phase so that a length of the positive terminal and the negative terminal of each leg in the interior of the power semiconductor module 4 can be reduced and made to be substantially the same, and a distance from the positive terminal and the negative terminal of each leg to the capacitor can be reduced, and accordingly a spike voltage can be reduced than the conventional one.

Figure 15:
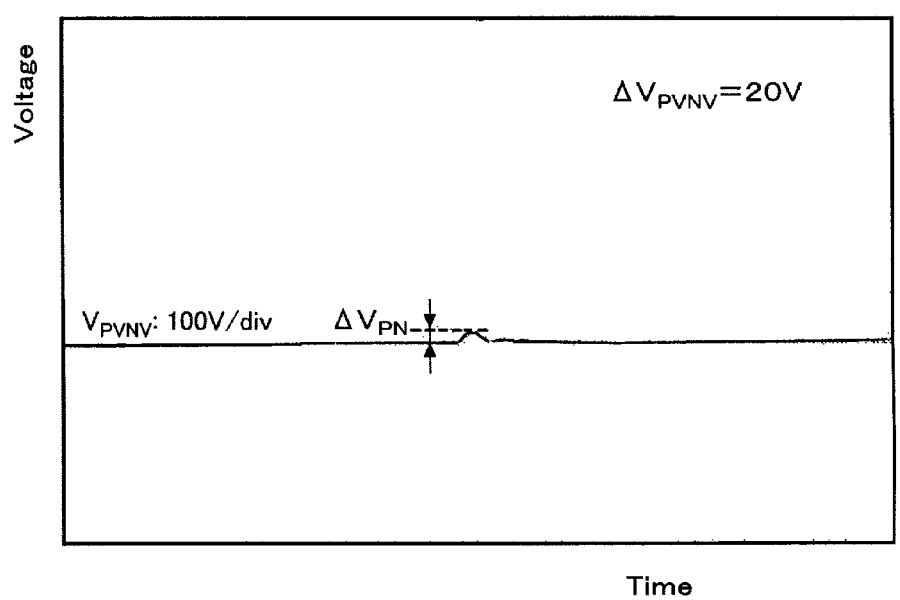
FIG. 15 is a graph indicating a measurement result of a spike voltage.
Figure 16:
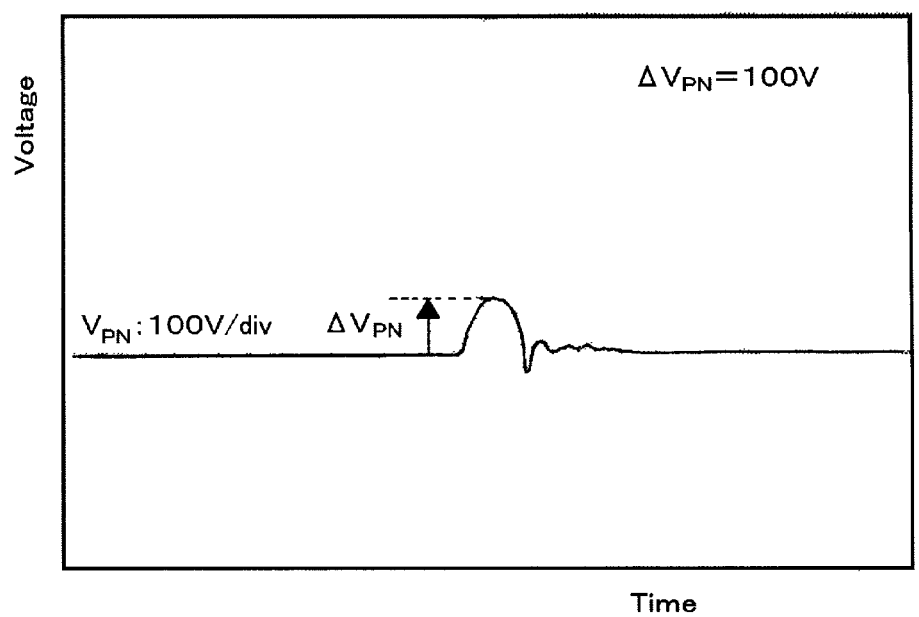
FIG. 16 is a graph indicating a measurement result of a spike voltage.

FIG. 15 is a graph indicating a measurement result of a spike voltage of the power semiconductor module 4 according to the present embodiment. FIG. 16 is a graph indicating a measurement result of a spike voltage of a conventional power semiconductor module. Comparing the graphs of FIGS. 15 and 16, a superimposed spike voltage $\Delta V_{PVNV}$ generated at the power supply terminal of V-phase which is generated at the time of turn-off of U-phase was smaller in comparison with the conventional module using a power supply terminal common to the three phases. In an example as illustrated, even when a switching rate at the time of turn-off is set to be approximately 1.5 times higher, $\Delta V_{PVNV}$ was one-fifth of the conventional one, approximately 20V.

The power semiconductor module 4 according to the present embodiment can include a cooler similar to that of the power semiconductor module 1 according to the first embodiment. Thus, even as a power semiconductor module to be mounted in a vehicle with a limited space for mounting, mounting the power semiconductor module can be easily made.

Embodiments of the power semiconductor module of the present invention and the like have been described above with reference to the accompanying drawings, but it is needless to say that the power semiconductor module of the present invention and the like are not limited to description of each embodiment and drawing and can be variously modified without departing from the spirit of the present invention.

DESCRIPTION OF SYMBOLS 1, 2 power semiconductor module
11 resin case
11a through hole
12 metal base plate
13, 23 cooling case
13a, 23a bottom wall
13b, 23b side wall
13c, 23c inlet portion
13d, 23d outlet portion
13e, 23e inlet opening
13f, 23f outlet opening
13g1, 23g1 flange (first flange)
13g2, 23g2 flange (second flange)
13eg, 23eg opening portion (first opening portion)
13fg, 23fg opening portion (second opening portion)
13h, 23h bolt hole
14D, 14E external terminal
15 insulation substrate
16 semiconductor chip (semiconductor element)
17 fin
25 film capacitor
31 flow path member

The invention claimed is:

1. A power semiconductor module comprising:
a metal base plate including a first surface and a second surface opposite to the first surface;
a multi-layer substrate including a third surface and a fourth surface opposite to the third surface, the fourth surface being joined to the first surface;
a semiconductor element mounted on the third surface;
a resin case disposed on the first surface of the metal base plate, the resin case surrounding the multi-layer substrate and the semiconductor element; and
a cooling case including
a bottom wall,
a side wall formed around the bottom wall and having one end of the side wall being joined to the second surface of the metal base plate to form a space enclosed by the metal base plate, the bottom wall, and the side wall for circulating a coolant,
an inlet portion having an inlet opening for introducing the coolant to the cooling case and an outlet portion having an outlet opening for discharging the coolant from the cooling case, the inlet portion and the outlet portion being connected to either the bottom wall or the side wall and disposed along a peripheral edge of the second surface of the metal base plate,
a first flange disposed at an inlet opening side of the inlet portion and having a main surface opposite to the inlet portion, the main surface of the first flange being parallel to a first surface of the metal base plate, and
a second flange disposed at an outlet opening side of the outlet portion and having a main surface opposite to the outlet portion, the main surface of the second flange being parallel to the first surface.

2. The power semiconductor module according to claim 1, wherein the first flange includes a first opening portion opposed to the inlet opening and a pair of first bolt holes disposed to have the first opening portion therebetween, and
the second flange includes a second opening portion opposed to the outlet opening and a pair of second bolt holes disposed to have the second opening portion therebetween.

3. The power semiconductor module according to claim 2, wherein the resin case includes a pair of first through holes corresponding to the first bolt holes and a pair of second through holes corresponding to the second bolt holes,
the first bolt holes and the first through holes are formed to receive bolts in a thickness direction of the resin case, and
the second bolt holes and the second through holes are formed to receive bolts in the thickness direction of the resin case.

4. The power semiconductor module according to claim 2, wherein a segment between the first bolt holes and a segment between the second bolt holes are substantially parallel to each other.

5. The power semiconductor module according to claim 4, wherein respective major axis directions of the first flange and the second flange extend along a long side direction of the metal base plate, the major axis direction of the first flange being a direction in which the first opening portion and the pair of first bolt holes are arranged, and the major axis direction of the second flange being a direction in which the second opening portion and the pair of second bolt holes are arranged.

6. The power semiconductor module according to claim 1, wherein the semiconductor element includes a plurality of first semiconductor elements which composes an upper arm of an inverter circuit and a plurality of second semiconductor elements which composes a lower arm of the inverter circuit, and
the first semiconductor elements and the second semiconductor elements are disposed along a movement direction of the coolant capable of circulating in the cooling case.

7. The power semiconductor module according to claim 1, wherein the first flange and the second flange are brazed each through a washer to the cooling case.

8. The power semiconductor module according to claim 1, further comprising:
a first pair including an upper arm and a lower arm, and a second pair including an upper arm and a lower arm,
wherein the multi-layer substrate includes a first multi-layer substrate and a second multi-layer substrate,
the semiconductor element includes first semiconductor elements, second semiconductor elements, third semiconductor elements, and fourth semiconductor elements, the first pair at least includes
the first multi-layer substrate,
the first semiconductor elements composing the upper arm and the second semiconductor elements composing the lower arm, and
a first power supply terminal supplying power to the first semiconductor elements and the second semiconductor elements, and
the second pair includes
the second multi-layer substrate,
the third semiconductor elements composing the upper arm and the fourth semiconductor elements composing the lower arm, and
a second power supply terminal supplying power to the third semiconductor elements and the fourth semiconductor elements.

9. The power semiconductor module according to claim 8, wherein the first power supply terminal includes a first positive terminal to connect to a positive side of a power source and a first negative terminal to connect to a negative side of the power source,
the second power supply terminal includes a second positive terminal to connect to the positive side of the power source and a second negative terminal to connect to the negative side of the power source,
the first positive terminal and the second positive terminal are different terminals and have a same shape, and
the first negative terminal and the second negative terminal are different terminals and have a same shape.

10. The power semiconductor module according to claim 9, wherein the first positive terminal and the second positive terminal have a same size, and the first negative terminal and the second negative terminal have a same size.

11. The power semiconductor module according to claim 9, wherein the first positive terminal and the second positive terminal each include a leg portion,
the first negative terminal and the second negative terminal each include a leg portion,
an extending direction of the leg portion of the first positive terminal and an extending direction of the leg portion of the first negative terminal are parallel to each other,
an extending direction of the leg portion of the second positive terminal and an extending direction of the leg portion of the second negative terminal are parallel to each other, and
the extending direction of the leg portion of the first positive terminal and the extending direction of the leg portion of the second positive terminal are parallel to each other.

12. The power semiconductor module according to claim 9, wherein the first positive terminal and the first negative terminal are configured in such a manner that a first capacitor can be connected therebetween, and the second positive terminal and the second negative terminal are configured in such a manner that a second capacitor can be connected therebetween.

13. The power semiconductor module according to claim 1, wherein the inlet opening is arranged at a bottom surface of the inlet portion opposite to the second surface of the metal base plate, and
the outlet opening is arranged at a bottom surface of the outlet portion opposite to the second surface of the metal base plate.

14. The power semiconductor module according to claim 13, wherein the inlet opening is configured so that the cooling case introduces the coolant from a bottom surface side of the inlet portion, and the first flange portion is disposed on the bottom surface side of the inlet portion.

15. The power semiconductor module according to claim 14, further comprising a plurality of first connecting members connecting the resin case, the metal base plate, and the first flange of the cooling case to each other, and
a plurality of second connecting members connecting the resin case, the metal base plate, and the second flange of the cooling case to each other,
wherein the inlet portion and the outlet portion protrude outwardly from the side wall of the cooling case away from the semiconductor element so that the plurality of first connecting members and the plurality of second connecting members are disposed between the side wall of the cooling case and the peripheral edge of the second surface of the metal base plate.

16. A flow path member adapted to combine with a power semiconductor module,
wherein the power semiconductor module includes:
a metal base plate; and
a cooling case including
a bottom wall,
a side wall formed around the bottom wall and having one end of the side wall being joined to a rear surface of the metal base plate to form a space enclosed by the metal base plate, the bottom wall, and the side wall for circulating a coolant,
an inlet portion having an inlet opening for introducing the coolant to the cooling case and an outlet portion having an outlet opening for discharging the coolant from the cooling case, the inlet portion and the outlet portion being connected to either the bottom wall or the side wall and disposed along a peripheral edge of the rear surface of the metal base plate,
a first flange disposed at an inlet opening side of the inlet portion and having a main surface opposite to the inlet portion, the main surface of the first flange being parallel to a first surface of the metal base plate, and
a second flange disposed at an outlet opening side of the outlet portion and having a main surface opposite to the outlet portion, the main surface being parallel to the first surface, and
the flow path member being disposed to face a bottom surface of the cooling case, and comprising:
a first connection portion adapted to connect to the first flange,
a second connection portion adapted to connect to the second flange,
a first flow path connected to the first connection portion for circulating the coolant, and
a second flow path connected to the second connection portion for circulating the coolant.

17. The flow path member according to claim 16, wherein the first flange includes a first opening portion facing the inlet opening and a pair of first bolt holes to have the first opening portion therebetween,
the second flange includes a second opening portion facing the outlet opening and a pair of second bolt holes to have the second opening portion therebetween,
the first connection portion is provided with nuts being positioned with respect to the first bolt holes, and
the second connection portion is provided with nuts being positioned with respect to the second bolt holes.

18. The flow path member according to claim 16, wherein the first connection portion and the second connection portion are each provided with a groove for housing an O-ring.

19. The power semiconductor module according to claim 16, wherein the first connection portion is formed on an upper surface of the flow path member facing the bottom surface of the cooling case to abut against the main surface of the first flange of the cooling case, and the second connection portion of the flow path member is formed on the upper surface of the flow path member to abut against the main surface of the second flange of the cooling case.

20. A power-semiconductor-module structure comprising:
a power semiconductor module including
 a metal base plate including a first surface and a second surface opposite to the first surface;
 a multi-layer substrate including a third surface and a fourth surface opposite to the third surface, the fourth surface being joined to the first surface;
 a semiconductor element mounted on the third surface;
 a resin case disposed on the first surface of the metal base plate and surrounding the multi-layer substrate and the semiconductor element; and
 a cooling case including
  a bottom wall, and
  a side wall formed around the bottom wall and having one end of the side wall being joined to the second surface of the metal base plate to form a space enclosed by the metal base plate, the bottom wall, and the side wall for circulating a coolant,
  an inlet portion having an inlet opening for introducing the coolant to the cooling case and an outlet portion having an outlet opening for discharging the coolant from the cooling case, the inlet portion and the outlet portion being connected to either the bottom wall or the side wall and disposed along a peripheral edge of the second surface of the metal base plate,
  a first flange disposed at an inlet opening side of the inlet portion and having a main surface opposite to the inlet portion, the main surface of the first flange being parallel to the first surface, and
  a second flange disposed at an outlet opening side of the outlet portion and having a main surface opposite to the outlet portion, the main surface of the second flange being parallel to the first surface, and
a flow path member being disposed to face a bottom surface of the cooling case and including
 a first connection portion to connect to the first flange,
 a second connection portion to connect to the second flange,
 a first flow path connected to the first connection portion for circulating the coolant, and a second flow path connected to the second connection portion for circulating the coolant.

21. The power-semiconductor-module structure according to claim 20, wherein the power semiconductor module and the flow path member are fastened by a plurality of bolts.

22. The power-semiconductor-module structure according to claim 20, wherein each of the first connection portion and the second connection portion is provided with a groove for housing an O-ring, and each groove is provided with the O-ring.

23. The power semiconductor module according to claim 20, wherein the first connection portion is formed on an upper surface of the flow path member facing the bottom surface of the cooling case to abut against the main surface of the first flange of the cooling case, and the second connection portion of the flow path member is formed on the upper surface of the flow path member to abut against the main surface of the second flange of the cooling case.

\* \* \* \* \*